United States Patent [19]

Mosley et al.

[11] 4,050,065

[45] Sept. 20, 1977

[54] DUAL SLOPE ANALOG TO DIGITAL CONVERTER WITH DELAY COMPENSATION

[75] Inventors: Gerald Mosley, Melrose Park; Ervin T. Raber, Norristown, both of Pa.

[73] Assignee: Leeds & Northrup Company, North Wales, Pa.

[21] Appl. No.: 579,762

[22] Filed: May 22, 1975

[51] Int. Cl.² .......................................... H03K 13/20
[52] U.S. Cl. ....................... 340/347 NT; 340/347 CC
[58] Field of Search ................. 340/347 NT, 347 AD, 340/347 CC; 324/99 D

[56] References Cited

U.S. PATENT DOCUMENTS

| | | | |
|---|---|---|---|
| 3,541,320 | 11/1970 | Beall | 340/347 NT |
| 3,566,265 | 2/1971 | Reid | 340/347 NT |
| 3,566,397 | 2/1971 | Walton | 340/347 NT |
| 3,667,055 | 5/1972 | Uchida | 340/347 NTX |
| 3,747,089 | 7/1973 | Sharples | 340/347 NT |
| 3,826,983 | 7/1974 | Garratt | 340/347 NT |

Primary Examiner—Charles D. Miller
Attorney, Agent, or Firm—Raymond F. MacKay; William G. Miller, Jr.

[57] ABSTRACT

An improved bi-polar dual slope analog to digital converter having an automatic zero offset correction circuit using a high gain D.C. amplifier inserted between the output of the integrating amplifier and the input of the comparator amplifier, having both positive and negative reference potentials, and having a delay compensation circuit, for compensating delay produced by circuit elements in the signal path, coupled between the reference potentials and an input of the integrating amplifier.

5 Claims, 3 Drawing Figures

DUAL SLOPE ANALOG TO DIGITAL CONVERTER WITH DELAY COMPENSATION

BACKGROUND OF THE INVENTION

1. Field of the Invention

This invention is related to dual slope analog to digital converters and especially to low level dual slope analog to digital converters wherein an automatic zero offset correction circuit is used.

2. Prior Art

Prior art auto-zero dual slope analog to digital converters have used the high gain non-linear comparator amplifier designed to produce either a large positive or negative output signal, also as the zero correcting amplifier resulting in over-correction first in one direction and then in the other direction. When a linear amplifier is inserted ahead of the comparator amplifier for stable zero correcting, then there may occur a delay when the combination is used as a comparator. This delay introduces non-linearity into the dual slope analog to digital conversion transfer function.

SUMMARY OF THE INVENTION

A precision dual slope analog to digital converter is disclosed having a differential input integrating amplifier whose output is connected to the input of a high gain linear buffer or zero-correcting amplifier with its output in turn connected to the input of a comparator amplifier. To make a conversion the unknown input signal is applied to either the inverting input or the non-inverting input of the differential input of the integrating amplifier. The output of the zero-correcting amplifier is periodically applied by way of a switch means to a storage capacitor connected between ground or zero potential and an input of the differential input integrating amplifier which is not coupled to the unknown input. The appropriate positive or negative reference potential is subsequently connected by way of a switch to either the inverting or non-inverting input of said differential input integrating amplifier to accomplish reverse integration. A delay compensation circuit is coupled between the not-selected reference potential and one of the differential inputs which is not connected by way of said switch for reverse integration.

DESCRIPTION OF THE PREFERRED EMBODIMENTS

Figure 1:
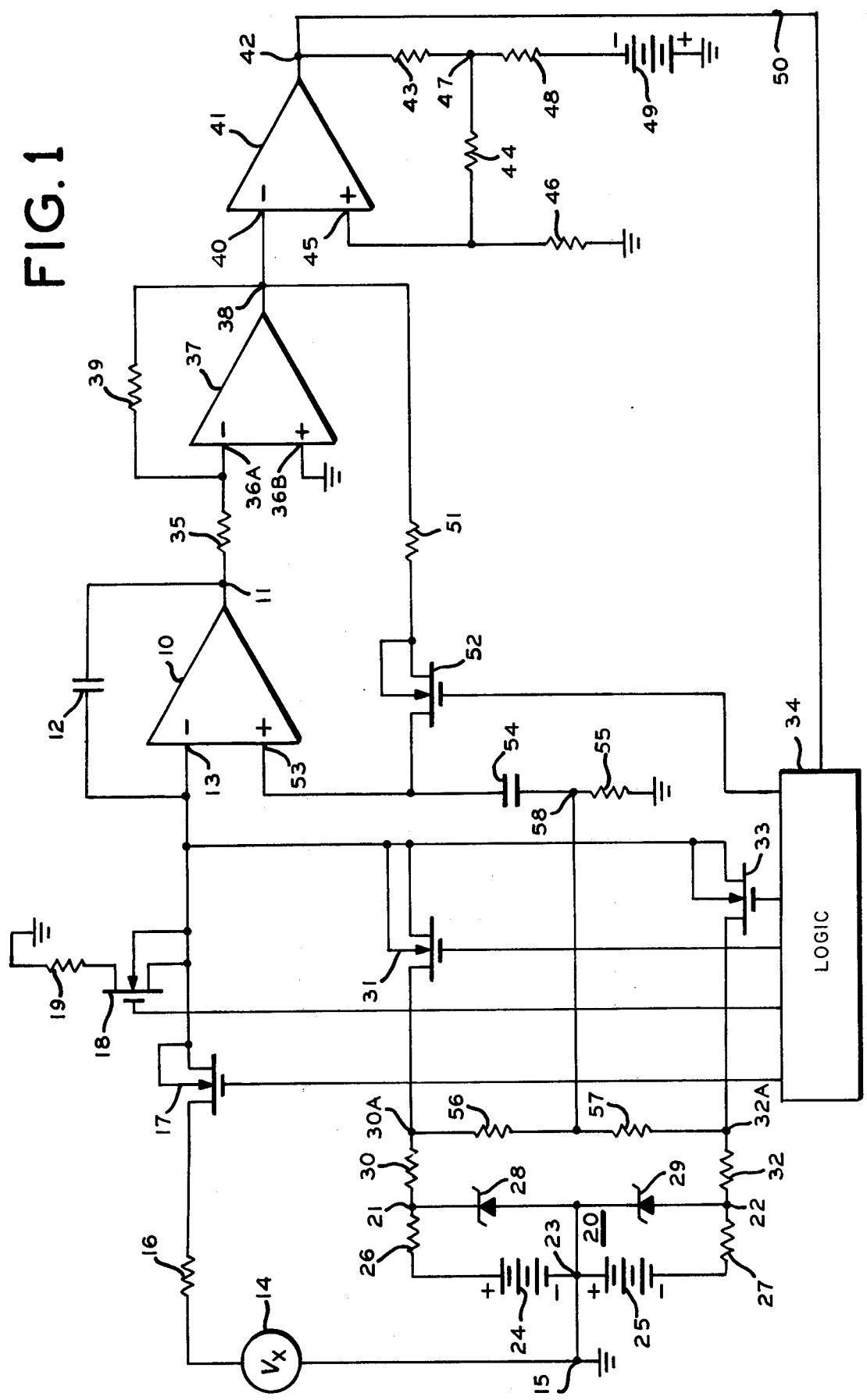
FIG. 1 shows a dual slope integrating amplifier analog to digital converter having an unknown signal to be measured applied to the inverting input of said integrating amplifier.

In FIG. 1 the integrating amplifier 10 may be a conventional high gain integrated circuit amplifier having an output 11 connected by way of an integrating capacitor 12 to an inverting input 13. The unknown signal source 14 to be converted has one of its terminals connected to circuit common 15 and its other terminal connected by way of resistor 16 and switching transistor 17 to the inverting input 13 of integrating amplifier 10. Another switching transistor 18 is also connected to the inverting input 13 for providing a resistive path by way of resistor 19 to circuit common.

A single source of reference potential 20 having a positive terminal, a negative terminal and a center terminal connected to circuit common may be used or two separate sources of reference potentials may be used. The source of reference potential 20 may derive its power from a source of rectified alternating current or from two batteries 24 and 25 as shown in FIG. 1. The battery 24 has a minus terminal connected to common terminal 23 and a positive terminal connected by resistor 26 to positive output terminal 21. Battery 25 has its positive terminal connected to common terminal 23 and its negative terminal connected by a resistor 27 to a negative output terminal 22. A Zener diode 28 is connected between positive output terminal 21 and common terminal 23 for regulating the positive potential at output terminal 21. Another Zener diode 29 is connected between negative output terminal and common terminal 23 for regulating the potential at negative output terminal 22. A precision scaling resistor 30 is connected between positive output terminal 21 by way of switching transistor 31 to apply a reference current to inverting input 13 when the unknown signal source 14 has a negative potential. Another precision scaling resistor 32 is connected between the negative output terminal 22 by way of switching transistor 33 to apply a reference current to inverting input 13 when the unknown signal source 14 has a positive potential.

During sample or input integration of the unknown input signal from unknown signal source 14 by the integrating amplifier 10, the switching transistor 18 is non-conductive while the switching transistor 17 is fully conductive for applying a signal from said unknown signal source 14 by way of resistor 16, and switching transistor 17 to the inverting input 13 producing an output at terminal 11 for charging capacitor 12. This sample or input integration proceeds for a predetermined interval of time, such as the full scale count of a register (not shown) which may be incorporated in the logic circuit 34. At the end of the input integration period switching transistor 17 is rendered non-conductive and depending upon the polarity of the unknown signal source 14, either switching transistor 31 or switching transistor 33 will be rendered conductive. This reference integration continues until the charge on integrating capacitor 12 is fully removed at which time the potential at output terminal 11 is zero. The duration of the reference integration period as measured by the count in the register (not shown) is proportional to the average magnitude of the signal from unknown signal source 14 during the sample or input integration period.

The potential at output 11 is sensed by amplifier 37 by way of resistor 35 connecting output 11 to an inverting input 36A of amplifier 37. The non-inverting input 36B of amplifier 37 is connected to circuit common. There is a feedback resistor 39 connected between the output 38 of amplifier 37 and its inverting input 36A. The output 38 is also connected to an input 40 of a comparator amplifier 41. The output 42 of comparator amplifier 41 is connected by way of resistors 43 and 44 in series circuit to non-inverting input 45 of comparator amplifier 41 as a positive feedback. This positive feedback circuit around comparator amplifier 41 serves to introduce a controlled hysteresis into the operating characteristic of the amplifier 41. Resistor 46 connects the non-inverting input 45 to circuit common. The junction 47 of resistors 43 and 44 is connected to circuit common by way of a resistor 48 in series circuit with a biasing potential represented as battery 49. If there is no signal applied to inverting input 40 and the output 42 has been negative a portion of the potential of battery 49 is applied to non-inverting input 45 by way of voltage dividing action consisting of resistors 48, 44 and 46. The output 42 will remain negative. When the signal applied to inverting input 40 is negative the output 42 tends to go positive but it will only go positive if the negative potential applied to inverting input 40 exceeds the negative potential applied to non-inverting input 45. When that happens the positive feedback path by way of resistors 43 and 44 will maintain the output at the positive potential. Also, the hysteresis will provide a dead band for comparator amplifier 41 which during automatic zero correction will prevent the comparator amplifier 41 from switching its output in avoidance of disturbances in the converter power supplies (not shown) caused by such switching action.

The output 42 of comparator amplifier 41 is connected by way of conductor 50 to the timing logic circuit 34 for indicating the existence of a zero potential condition at the output 11 of integrating amplifier 10 at the end of the reference integration period. The conductor 50 also transmits to timing logic circuit 34 the polarity of the unknown signal source 14 during the sample integration period.

Additionally, there is a zero offset correction circuit which consists of a resistor 51 and switching transistor 52 connected in series circuit between the output 38 of high gain linear amplifier 37 and the non-inverting input 53 of integrating amplifier 10. The switching transistor 52 is rendered conductive during an interval of time between detection of zero at output 11 at the end of the reference integration period and before the next sample integration period. During this zero correction interval of time, switching transistors 17, 31 and 33 are non-conductive, and switching transistors 18 and 52 are fully conductive. Any zero offset in amplifiers 10 and 37 will produce an output at terminal 38 which by way of resistor 51 and switching transistor 52 is applied as a correction signal to input 53. Furthermore, this correction signal is stored on a storage means such as capacitor 54 which is connected in series with a resistor 55 between input terminal 53 and circuit common to provide zero offset correction during the subsequent input and reference integration periods.

The analog to digital converter circuit described has an inherent lag or delay during turn around from sample integration to reference integration which appears in the final readout as a step offset error producing a nonlinearity in the analog to digital converter response in spite of the fact that a zero correction circuit has been included. A novel delay compensation circuit is provided in FIG. 1 by resistors 56 and 57 in conjunction with resistor 55. Resistor 56 is connected between the junction 30A of resistor 30 and switching transistor 31 and the junction 58 of capacitor 54 and resistor 55. The resistor 57 is connected between the junction 32A of resistor 32 and switching transistor 33 and junction 58.

During the reference integration period it will be recalled that either switching transistor 31 or switching transistor 33 is rendered conductive depending upon the polarity of unknown signal source 14. Assuming the unknown signal source 14 input signal is positive, then during the reference integration switching transistor 33 will be rendered conductive. At the moment switching transistor 33 is rendered conductive junction 32A is substantially at the potential of circuit common and there is developed a positive potential from output terminal 21 by way of resistors 30, 56 and 57 which is applied to junction 58 thus elevating the potential of capacitor 54 by a predetermined magnitude in accordance with the resistive voltage divider action of resistors 56, 57 and 55. The potential elevation of capacitor 54 in turn elevates the potential of the non-inverting input 53 of integrating amplifier 10 thus compensating for the step offset error in one direction caused by the inherent lag or delay. Similarly, at the instant switching transistor 31 is rendered conductive during reference integration because of a negative potential unknown signal source 14, junction 30A is substantially at the potential of circuit common and there is developed a negative potential from output terminal 22 by way of resistors 32, 57 and 56 which is applied to junction 58 thus lowering the potential of capacitor 54 by a predetermined magnitude in accordance with the resistive voltage divider action of resistors 57, 56 and 55. The lowering of potential of capacitor 54 in turn lowers the potential of the non-inverting input 53 of integrating amplifier 10 thus compensating for the step offset error in the other direction caused by the inherent lag or delay.

All of the switching transistors 17, 18, 31, 33 and 52 are shown to be insulated gate field-effect transistors.

Figure 2:
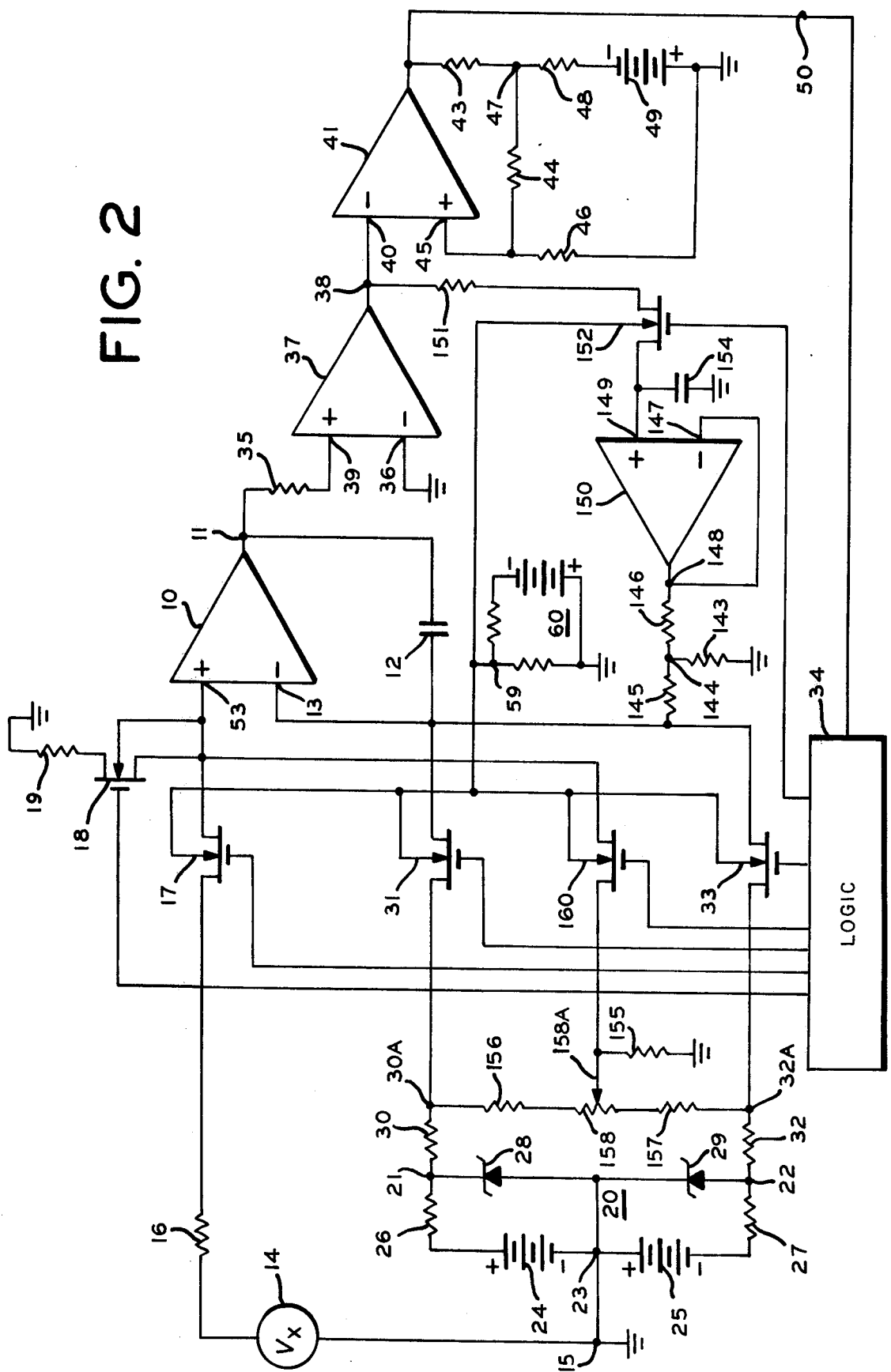
FIG. 2 shows a dual slope integrating amplifier analog to digital converter having an unknown signal to be measured applied to the non-inverting input of said integrating amplifier.

The dual slope analog to digital converter system described in FIG. 1 has a modest input impedance. However, by rearranging the integrating amplifier circuitry, the input impedance could be considerably enhanced as shown in FIG. 2. In FIG. 2, the unknown signal source 14 is applied by way of resistor 16 and switching transistor 17 to the non-inverting input 53 of integrating amplifier 10 while the integrating capacitor 12 is connected between the output 11 and inverting input 13. As in FIG. 1 the positive and negative reference potentials are connected to inverting input 13 by way of resistor 30 and switching transistor 31, and resistor 32 and switching transistor 33, respectively. The output 11 is connected by way of resistor 35 to the non-inverting input 39 of high gain linear amplifier 37 while the inverting input 36 is connected to circuit common.

The comparator amplifier 41 in FIG. 2 is connected in an identical manner as that shown in FIG. 1. For the zero correction of integrating amplifier 10, the output 38 is connected by way of resistor 151 to a switching transistor 152 to the non-inverting input 149 of an operational amplifier 150 connected in the follower configuration, i.e., the output 148 is directly connected to the inverting input 147. The output 148 is connected by way of resistors 146 and 145 in series circuit to the inverting input 13 of integrating amplifier 10. The junction 144 of resistors 145 and 146 is connected to circuit common by way of a resistor 143.

The delay compensation circuit in FIG. 2 consists of a resistor 156, a potentiometer 158 and another resistor 157 in series circuit between the junction 30A between resistor 30 and switching transistor 31 and junction 32A between resistor 32 and switching transistor 33. The movable arm 158A of potentiometer 158 is connected to circuit common by way of a resistor 155 and is also connected to non-inverting input 53 by way of switching transistor 160. The other switching transistor operations of FIG. 2 are identical to that described in FIG. 1 and will not be repeated.

Figure 3:
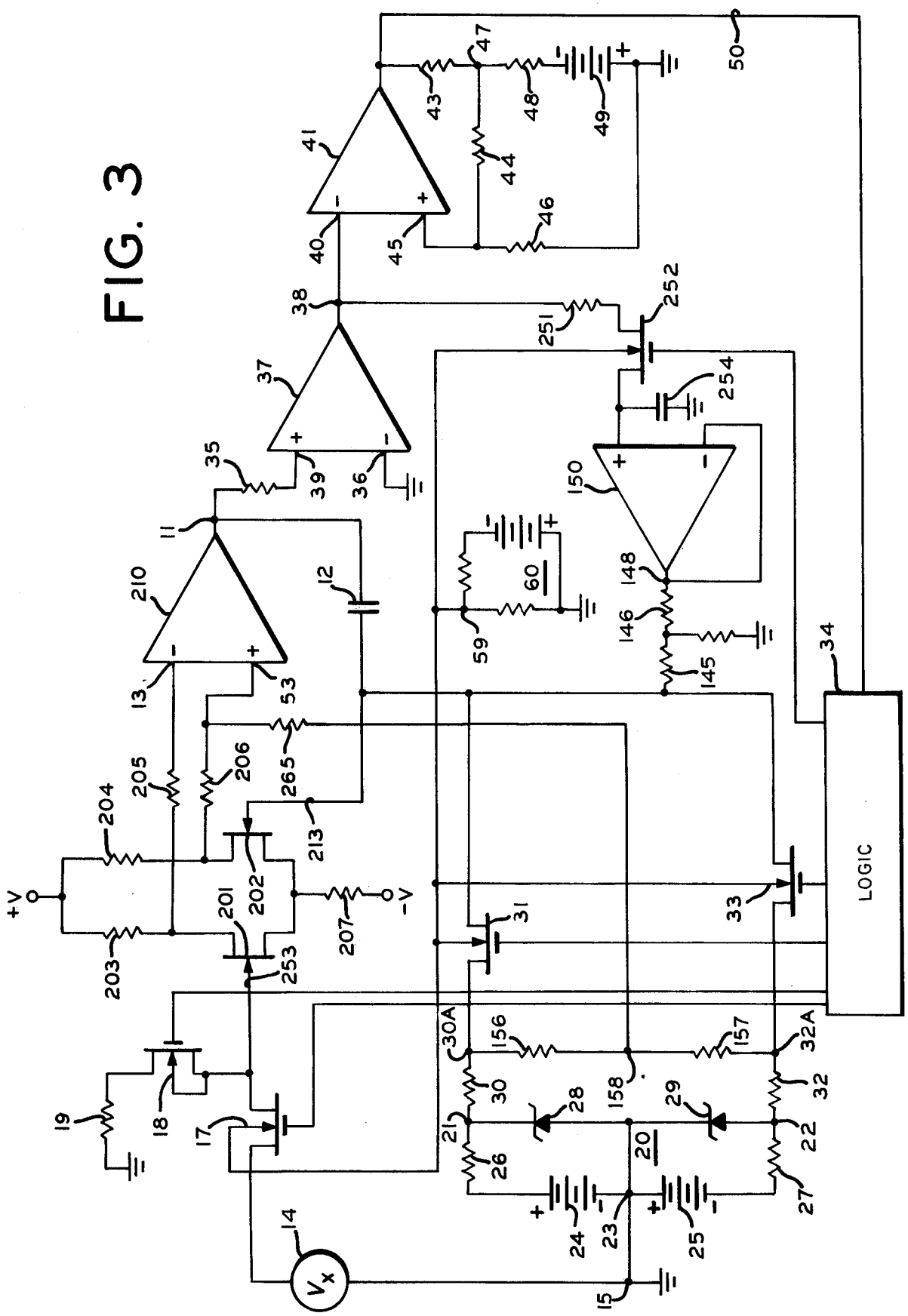
FIG. 3 shows a dual slope integrating amplifier analog to digital converter having a pair of field effect transistors connected in the differential mode as the input stage of said integrating amplifier and also having the unknown input connected to the non-inverting input.

The input impedance of the dual slope analog to digital converter system described in FIG. 2 may be further increased by inserting a pair of field-effect transistors 201, 202 connected as a differential amplifier between the unknown signal source 14 and the integrating amplifier 10 of FIG. 1, as shown in FIG. 3. The unknown signal source 14 is connected by way of switching transistor 17 to the gate electrode 253 of field-effect transistor 201. The drain electrode of field-effect transistor 201 is connected to a source of potential +V by way of resistor 203. The drain electrode is also connected by way of resistor 205 to the inverting input 13 of an operational amplifier 210. The integrating capacitor 12 is connected by way of output 11 to the gate electrode 213 of field-effect transistor 202. THe source electrodes of both field-effect transistors 201, 202 are connected together and by way of a resistor 207 to a source of negative potential −V. The high gain linear amplifier 37 and the comparator amplifier 41 are connected in a manner identical to that shown in FIG. 2. The zero correcting circuit is also identical to that shown in FIG. 2 except the output 148 by way of resistors 146, 145 in series circuit is connected to gate electrode 213 of field-effect transistor 202. Similarly, the reference potential for the reference integration is identical to that shown in FIG. 2 except the connection is made to the gate electrode 213. The delay compensation circuit includes a pair of equal-valued resistors 156 and 157 connected between junction 30A and 32A. The junction 158 between the resistors 156 and 157 is connected by way of resistor 265 to the non-inverting input 53 of operational amplifier 210.

The operation of the system described in FIG. 3 is otherwise identical to that shown in FIG. 1 and will not be repeated.

What is claimed is:

1. An improved precision dual slope analog to digital converter having an input signal sample integration period and a reference integration period, comprising:
   a differential input integrating amplifier having an inverting input, a non-inverting input and an output,
   a high gain linear amplifier having an output and an input connected to the output of said integrating amplifier,
   a source of analog signal of unknown magnitude to be converted,
   first means for periodically coupling said source of signal to an input of said differential input integrating amplifier for a fixed period of sample integration,
   a source of reference potential having a positive terminal, a negative terminal and a common terminal,
   second means including switches directly connected to said differential input integrating amplifier for periodically coupling one of said positive and negative terminals of said source of reference potential to one of the two inputs of said differential input integrating amplifier for a variable period of reference integration following said fixed period of sample integration, and
   third means additionally coupling said positive reference terminal and said negative reference terminal to one of the two inputs of said differential input integrating amplifier for applying a signal of one polarity to one of said inputs of said differential input integrating amplifier when said second means applies a signal of opposite polarity to the other of said inputs for turn-around delay compensation.

2. An improved precision dual slope analog to digital converter having an input signal sample integration period and a reference integration period comprising
   amplifier means including an integrating amplifier for performing said input signal sample integration and said reference integration,
   a source of reference voltage,
   switching means for applying to said integrating amplifier means during said reference integration period a first signal from said source of reference voltage to produce a ramp change in the output of said integrating amplifier, and
   delay compensation circuit means connected between said source of reference voltage and said amplifier means for applying to said integrating amplifier means throughout said reference integration period a second signal from said source of reference voltage to produce a step change in the output of said integrating amplifier to compensate for the inherent turn around delay in the response of said amplifier means.

3. An improved precision dual slope analog to digital converter having an input signal sample integration period and a reference integration period, comprising:
   a differential input integrating amplifier having an inverting input, a non-inverting input and an output,
   a high gain linear amplifier having an output and an input connected to the output of said integrating amplifier,
   a source of analog signal of unknown magnitude to be converted,
   first means periodically coupling said source of signal to said non-inverting input of said differential input integrating amplifier for a fixed period of sample integration,
   a source of reference potential having a positive terminal, a negative terminal and a common terminal,
   second means during said reference integration period coupling said inverting input of said differential input integrating amplifier to said positive terminal of said source of reference potential when said unknown signal source has a positive potential and to said negative terminal of said source of reference potential when said unknown signal source has a negative potential for a variable period of reference integration following said fixed period of sample integration,
   storage means comprising a first operational amplifier connected as a follower having a capacitor connected between its input and circuit common and having its output connected to said inverting input of said differential input integrating amplifier,
   third means for periodically coupling the output of said high gain linear amplifier to said storage means prior to one of said fixed periods of integration, and
   means including a pair of equal valued resistors connected in series circuit relation between said positive and said negative reference potentials, and a resistor connected between the junction of said equal valued resistors and circuit common for coupling a negative signal through said one of said equal valued resistors to said non-inverting input of said integrating amplifier when said inverting input is coupled to said positive terminal of said reference potential, and a positive signal is conducted through the other of said equal valued resistors to said non-inverting input of said integrating amplifier when said inverting input is coupled to said negative terminal of said source of reference potential to improve the low level precision of the converter.

4. An improved precision dual slope analog to digital converter having a fixed period of input signal sample integration and a variable period of reference integration, comprising:

a differential preamplifier, an operational amplifier having an input circuit and an output circuit, said input circuit of said operational amplifier being connected to an output of said preamplifier, an integrating capacitor connection between said output of said operational amplifier and said input circuit of said preamplifier, a high gain linear amplifier having an output and an input connected to the output of said operational amplifier, a source of analog signal of unknown magnitude to be converted, first means for periodically coupling said unknown signal source to said input circuit of said preamplifier during said sample integration period, a source of reference potential having a positive terminal, a negative terminal and a common terminal, second means for periodically coupling one of said positive and negative terminals of said source of reference potential to one of the two inputs of said differential preamplifier for said period of reference integration following said period of sample integration, storage means comprising a second operational amplifier connected as a follower having a capacitor connected between its input and circuit common and having its output connected to said input circuit of said preamplifier, third means for periodically coupling the output of said high gain linear amplifier to said storage means prior to one of said fixed periods of integration, a pair of equal value resistors connected in series between said positive and said negative reference potentials, and coupling means including a resistor connected from the junction of said equal value resistors to an input of said operational amplifier to improve the low level precision of the converter.

5. An improved precision dual slope analog to digital converter having an input signal sample integration period and a reference integration period, comprising:

a differential input integrating amplifier having an inverting input, a non-inverting input and an output, a high gain linear amplifier having an output and an input connected to the output of said integrating amplifier, a source of analog signal of unknown magnitude to be converted, first means for periodically coupling said source of signal to an input of said differential input integrating amplifier for a fixed period of sample integration, a source of reference potential having a positive terminal, a negative terminal and a common terminal, a first resistor having one end connected to said negative terminal, a second resistor having one end connected to said positive terminal, switching means connected between said resistors and one of said inputs of said differential input integrating amplifier for periodically coupling one of said resistors to said input for a variable period of reference integration following said fixed period of sample integration, storage means connected between circuit common and the other input of said differential input integrating amplifier, second means for periodically coupling the output of said high gain linear amplifier to said storage means prior to one of said fixed periods of integration, and third means providing a direct resistive connection between the junctions of said first and second resistors and said switching means and coupling a midpoint of said connection to said differential input integrating amplifier for applying a signal of one polarity to said integration amplifier input when said switching means applies a signal of opposite polarity to said one input of said integrating amplifier for turn-around delay compensation.

* * * * *